(12) United States Patent
Inaura

(10) Patent No.: US 11,102,920 B2
(45) Date of Patent: Aug. 24, 2021

(54) COMPONENT MOUNTING DEVICE AND POSITION RECOGNITION METHOD

(71) Applicant: FUJI CORPORATION, Chiryu (JP)

(72) Inventor: Yuki Inaura, Chiryu (JP)

(73) Assignee: FUJI CORPORATION, Chiryu (JP)

(*) Notice: Subject to any disclaimer, the term of this patent is extended or adjusted under 35 U.S.C. 154(b) by 232 days.

(21) Appl. No.: 16/327,673

(22) PCT Filed: Sep. 1, 2016

(86) PCT No.: PCT/JP2016/075657
§ 371 (c)(1),
(2) Date: Feb. 22, 2019

(87) PCT Pub. No.: WO2018/042590
PCT Pub. Date: Mar. 8, 2018

(65) Prior Publication Data
US 2019/0191606 A1 Jun. 20, 2019

(51) Int. Cl.
*H05K 13/08* (2006.01)
*G06T 7/11* (2017.01)
(Continued)

(52) U.S. Cl.
CPC ....... *H05K 13/0812* (2018.08); *G06T 7/0006* (2013.01); *G06T 7/11* (2017.01); *H05K 13/0406* (2018.08); *H05K 13/0413* (2013.01); *H05K 13/0813* (2018.08); *G06T 2207/30136* (2013.01); *G06T 2207/30152* (2013.01)

(58) Field of Classification Search
CPC ............... G06T 7/0006; G06T 7/11; G06T 2207/30136; G06T 2207/30152; H05K 13/0406; H05K 13/0413; H05K 13/0812; H05K 13/0813
See application file for complete search history.

(56) References Cited

U.S. PATENT DOCUMENTS

| | | | | |
|---|---|---|---|---|
| 5,911,001 A | * | 6/1999 | Kawada | G06K 9/6203 382/141 |
| 7,076,094 B2 | * | 7/2006 | Chi | G06T 7/0002 382/146 |

(Continued)

FOREIGN PATENT DOCUMENTS

| | | |
|---|---|---|
| JP | 2002-280799 A | 9/2002 |
| WO | 03/043400 A1 * | 5/2003 |

OTHER PUBLICATIONS

International Search Report dated Nov. 29, 2016 in PCT/JP2016/075657 filed Sep. 1, 2016.

*Primary Examiner* — Carl J Arbes
(74) *Attorney, Agent, or Firm* — Oblon, McClelland, Maier & Neustadt, L.L.P.

(57) ABSTRACT

A component mounting device capable of selectively performing a tolerance check mode that recognizes a position of a lead after determining whether the size of a lead region is within a tolerance range, and a non-tolerance check mode that recognizes a position of the lead without performing determination of whether the size of the lead region is within the tolerance range. Therefore, even in cases in which it is difficult to set a tolerance range due to the tip of the lead being covered with a viscous fluid such as solder or plating, the position of the lead is appropriately recognized.

5 Claims, 6 Drawing Sheets

(51) Int. Cl.
*H05K 13/04* (2006.01)
*G06T 7/00* (2017.01)

(56) References Cited

U.S. PATENT DOCUMENTS 7,715,614 B2 * 5/2010 Hoshikawa .......... G05B 19/409
                  382/141
7,813,559 B2 * 10/2010 Duquette ........... H05K 13/0818
                  382/219

* cited by examiner (a) 
(b)

(a)

(b)

COMPONENT MOUNTING DEVICE AND POSITION RECOGNITION METHOD

TECHNICAL FIELD

The present application relates to a component mounting device and a position recognition method.

BACKGROUND ART

Conventionally, there is a component mounting device for mounting a component with leads onto a board by inserting the leads into insertion holes of the board. For example, a component mounting device of patent literature 1 shines light from the sides of the leads, images the component from below, detects regions with the same shape as a cross section of the leads from the captured image as the positions of the leads, then corrects the mounting position of the component on the board based on the positions of the detected leads. Further disclosed is subsequently applying solder to the leads of the mounted component.

CITATION LIST

Patent Literature

Patent literature 1: JP-A-2002-280799

BRIEF SUMMARY

Technical Problem

However, there are cases in which components are mounted by being inserted into insertion holes of a board after solder has been applied to the leads of the component. In this case, because leads with solder applied are imaged from below, a region larger than the cross section of the lead may appear in the image. Therefore, with a component mounting device such as the one above that detects a region with the same shape as a cross section of a lead as the position of the lead, the position of the lead may not be detected correctly.

An object of the present disclosure is to more appropriately detect a position of a lead of a component.

Solution to Problem

The present disclosure uses the following means to achieve the above object.

A component mounting device of the present disclosure is for mounting a component with a lead onto a board by inserting the lead into an insertion hole of the board, the component mounting device including:
an imaging device configured to image the component in a state being held; and
a processing section configured to perform recognition processing for recognizing a position of the lead by processing a captured image captured by the imaging device, the processing section being further configured to selectively perform
first recognition processing of extracting a lead region from the captured image, performing region determination of determining whether a size of the lead region is within a specified tolerance range, and in a case in which the size of the lead region is determined to be within the specified tolerance range, recognizing the position of the lead based on the lead region, and
second recognition processing of extracting the lead region from the captured image and recognizing the position of the lead based on the lead region without performing the region determination.

With a component mounting device of the present disclosure, it is possible to selectively perform first recognition processing of extracting a lead region from the captured image, performing region determination of determining whether a size of the lead region is within a specified tolerance range, and in a case in which the size of the lead region is determined to be within the specified tolerance range, recognizing the position of the lead based on the lead region, and second recognition processing of extracting the lead region from the captured image and recognizing the position of the lead based on the lead region without performing the region determination. By performing the first recognition processing, it is possible to appropriately recognize the position of the lead from the lead region that is within the specified tolerance range. Further, by performing the second recognition processing, because the position of the lead can be recognized without setting a specified tolerance range, it is possible to appropriately recognize the position of the lead even in a case in which it is difficult to set a tolerance range due to the tip of the lead being covered with a viscous fluid such as solder or plating.

A component mounting device of the present disclosure may further include a memory section configured to memorize position information of the lead for the component, wherein the processing section extracts from the captured image a region corresponding to a position based on the position information of the lead as the lead region. Accordingly, incorrect detection of the position of the lead is prevented in the second recognition processing in which region determination is not performed.

With a component mounting device of the present disclosure the processing section, during the second recognition processing, may recognize the position of the lead based on the lead region after checking that the size of the lead region does not correspond to a specified exception range that is larger than the tolerance range. Accordingly, in a case in which the lead region corresponds to the specified exception range due to, for example, being extremely large with respect to the lead diameter, it is possible to not perform recognition of the lead position in the second recognition processing.

A component mounting device of the present disclosure may further include a receiving section configured to receive a selection by an operator of either the first recognition processing or the second recognition processing, wherein the processing section performs the first recognition processing or the second recognition processing based on the selection by the operator. Accordingly, the position of the lead can be detected appropriately with greater freedom for an operator to select processing.

A position recognition method of the present disclosure is for recognizing a position of a lead of a component, the position recognition method including: (a) imaging the component in a state being held; and (b) performing recognition processing for recognizing a position of the lead by processing a captured image captured in (a), wherein in (b) a step (b1) of extracting a lead region from the captured image, performing region determination of determining whether a size of the lead region is within a specified tolerance range, and in a case in which the size of the lead region is determined to be within the specified tolerance range, recognizing the position of the lead based on the lead region, and a step (b2) of extracting the lead region from the captured image and recognizing the position of the lead based on the lead region without performing the region determination, are selectively performed.

With a position recognition method of the present disclosure, it is possible to selectively perform a step (b1) performing region determination of determining whether a size of the lead region extracted from a captured image is within a specified tolerance range, and in a case in which the size of the lead region is determined to be within the specified tolerance range, recognizing the position of the lead based on the lead region, and a step (b2) recognizing the position of the lead based on the lead region extracted from the captured image without performing the region determination. Using step (b1) it is possible to appropriately recognize the position of the lead from the lead region that is within the specified tolerance range. Also, using step (b2), because the position of the lead can be recognized without setting a specified tolerance range, it is possible to appropriately recognize the position of the lead even in a case in which it is difficult to set a tolerance range due to the tip of the lead being covered with a viscous fluid such as solder or plating.

DESCRIPTION OF EMBODIMENTS

Figure 1:
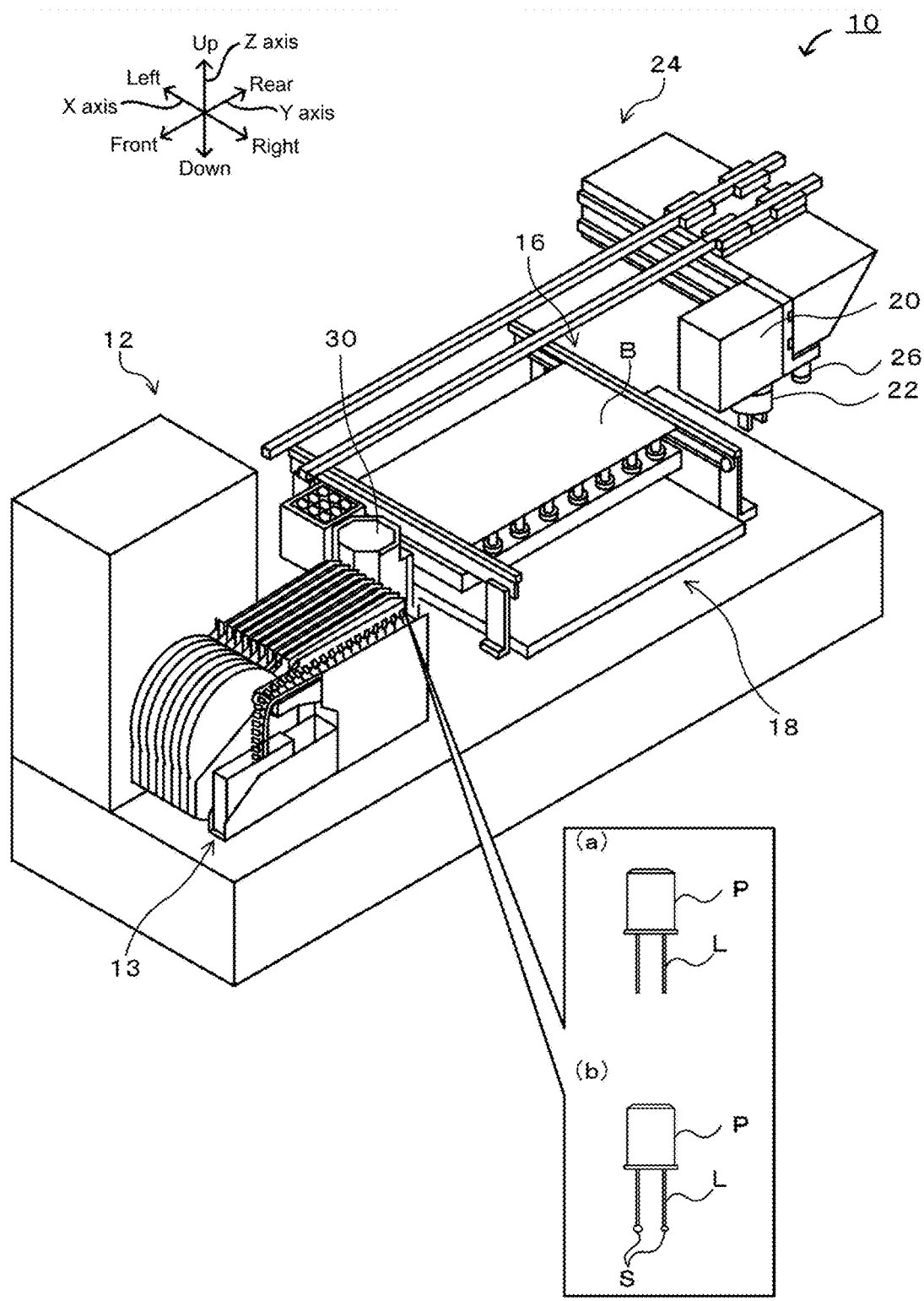
FIG. 1 schematically illustrates the configuration of component mounting device 10.
Figure 2:
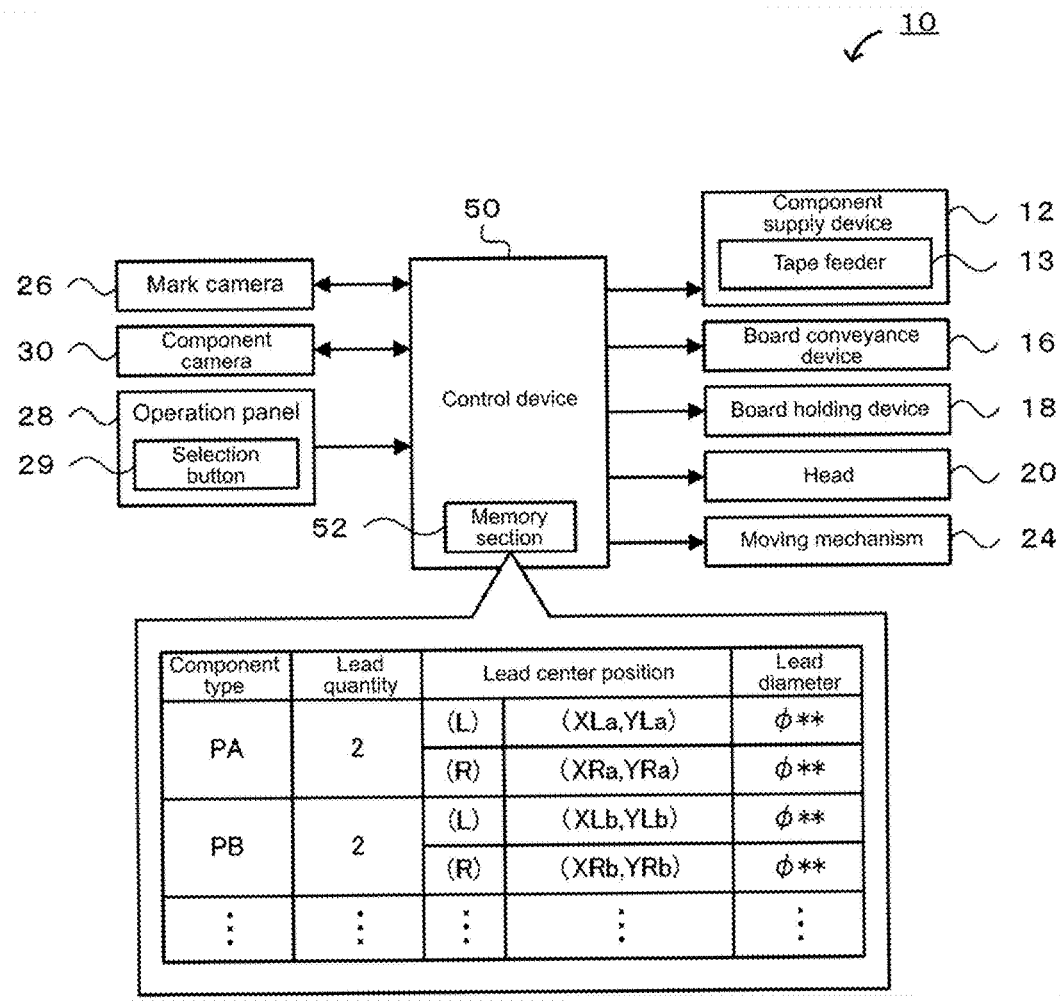
FIG. 2 is a block diagram showing the configuration of control related items of component mounting device 10.

FIG. 1 schematically illustrates a configuration of component mounting device 10 and FIG. 2 is a block diagram showing the configuration of control related items of component mounting device 10. Note that, in FIG. 1, the left-right direction is the X-axis direction, the front-rear direction is the Y-axis direction, and the up-down direction is the Z-axis direction.

As shown in FIG. 1, component mounting device 10 is provided with component supply device 12 that supplies components P, board conveyance device 16 that conveys board B that is flat, board holding device 18 that holds board B that was conveyed, head 20 attached to which is component chuck device 22 used to grip component P, and moving mechanism 24 for moving head 20 in XY directions. Also, component mounting device 10 is provided with mark camera 26 that images marks provided on board B, component camera 30 that images components P held by component chuck device 22, operation panel 28 (refer to FIG. 2) provided with selection button 29 and the like for receiving various operation instructions from an operator, and control device 50 that performs overall control of component mounting device 10. Component chuck device 22 grips component P using chuck claws that can open and close, and is removably attached to head 20. As well as component chuck device 22, a component suction device that picks up component P using a nozzle may be attached to head 20.

Component supply device 12 is provided with tape feeder 13 or the like for supplying components P by feeding tape holding leaded components P (such as radial components as shown in FIG. 1 or axial components that are not shown). Tape feeder 13 supplies components P (refer to FIG. 1[a]) for which the tips of the leads L are not applied with viscous fluid such as solder S or plating and components P (refer to FIG. 1[b]) for which the tips of the leads L are applied with viscous fluid such as solder S or plating. The application amount of solder S or the like and the shape after application may vary between each component P, and may vary between each lead L of the same component P. When component P is mounted onto board B, leads L are inserted into insertion holes formed in board B.

Head 20 is provided with a raising and lowering mechanism and a rotation mechanism, which are not shown, to rotate around an axis (spin) and raise and lower in the Z-axis direction component chuck device 22 or a component suction device attached to head 20. An air path connected to a negative pressure source such as an air pump, which is not shown, is also provided in head 20. Head 20 grips component P with component chuck device 22 or picks up component P with the component suction device by negative pressure being supplied from the negative pressure source via the air path.

Figure 3:
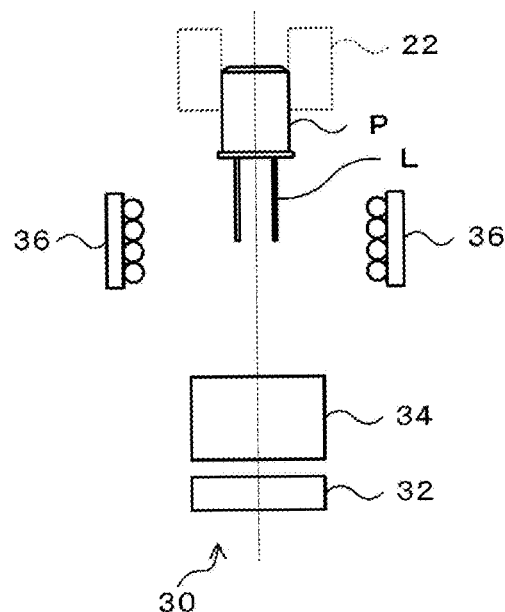
FIG. 3 schematically illustrates the configuration of component camera 30.

Component camera 30 images component P gripped by component chuck device 22 from below when the component P passes above component camera 30 and outputs the captured image to control device 50. FIG. 3 schematically illustrates the configuration of component camera 30. As shown in FIG. 3, component camera 30 is provided with imaging element 32 with a rectangular imaging region formed from multiple light receiving elements arranged in a two-dimensional grid, such as a CCD, lens 34 provided above imaging element 32, and lighting device 36 that shines light from the sides of the leads when component P is being imaged.

Control device 50 is configured from items such as a CPU, ROM, RAM, and an HDD, and performs overall control of the mounting device. As shown in FIG. 2, control device 50 outputs drive signals to each of component supply device 12, board conveyance device 16, and board holding device 18, outputs drive signals to head 20 (component chuck device 22), outputs drive signals to moving mechanism 24, and outputs drive signals to mark camera 26 and component camera 30. Also, control device 50 receives operation signals from operation panel 28 and receives images captured by mark camera 26 and component camera 30. Control device 50 memorizes an image processing program and various types of information on memory section 52, which is ROM or an HDD or the like. Memory section 52 memorizes component information related to component P with leads. Component information includes component type indicating the type of component P, a quantity of leads L that component P has, a center position of each lead L, and an outer diameter of leads L. The center position of lead L is, as position coordinates at which the center of leads L exist in the captured image of component P being held in a state not tilted at an angle or deviated, represented by XY coordinates taking the center position of the captured image (the center of component P captured by component camera 30) as a reference. For example, from the two leads on component type "PA", the coordinates (Xla, YLa) are defined as the center of the left side lead (L).

Figure 4:
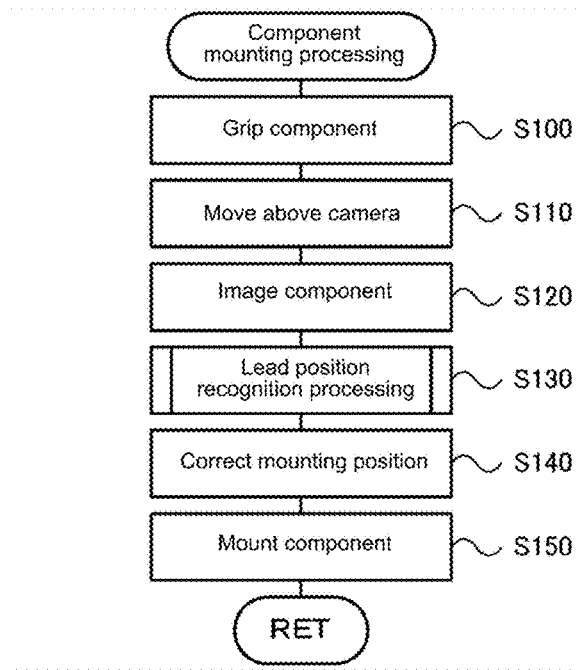
FIG. 4 is a flowchart showing an example of component mounting processing.

Below, an operation of the component mounting apparatus 10 configured as described above will be described. FIG. 4 is a flowchart showing an example of component mounting processing. This processing is performed by control device 50.

When component mounting processing is performed, control device 50, first, grips component P supplied from component supply device 12 with component chuck device 22 (S100). Control device 50 controls component supply device 12 such that component P is fed to a component supply position, and controls moving mechanism 24 and head 20 such that head 20 is positioned above the component supply position and the component P is gripped by component chuck device 22. Continuing, control device 50 controls moving mechanism 24 such that the component P gripped by component chuck device 22 is moved above board B via a route over component camera 30 (S110), and controls component camera 30 to image component P when component P is above component camera 30 (S120). Next, control device 50 performs lead position recognition processing to recognize the position (center position) of leads L by processing the image captured in S120 (S130). Details of this lead position recognition processing are described later.

Then, control device 50 corrects the mounting position of component P based on the recognized positions of leads L (S140), mounts the component P at the corrected mounting position on board B (S150), then ends component mounting processing. Here, component P gripped by component chuck device 22 may be tilted or deviated from a normal state. Therefore, control device 50, to correctly insert leads L into insertion holes of board B, mounts component P on board B in S150 after correcting the mounting position in the XY direction and the mounting direction in an axial direction based on the positions of the leads L in S140. Also, control device 50, in S150, controls moving mechanism 24 and head 20 such that the tips of leads L of component P held by component chuck device 22 are directly above the insertion holes of board B. Further, control device 50 controls head 20 such that component chuck device 22 is lowered until leads L are inserted into the insertion holes, then turns off the supply of negative pressure from the negative pressure source such that the grip of component P by component chuck device 22 is released and the component P is mounted on the board.

Figure 5:
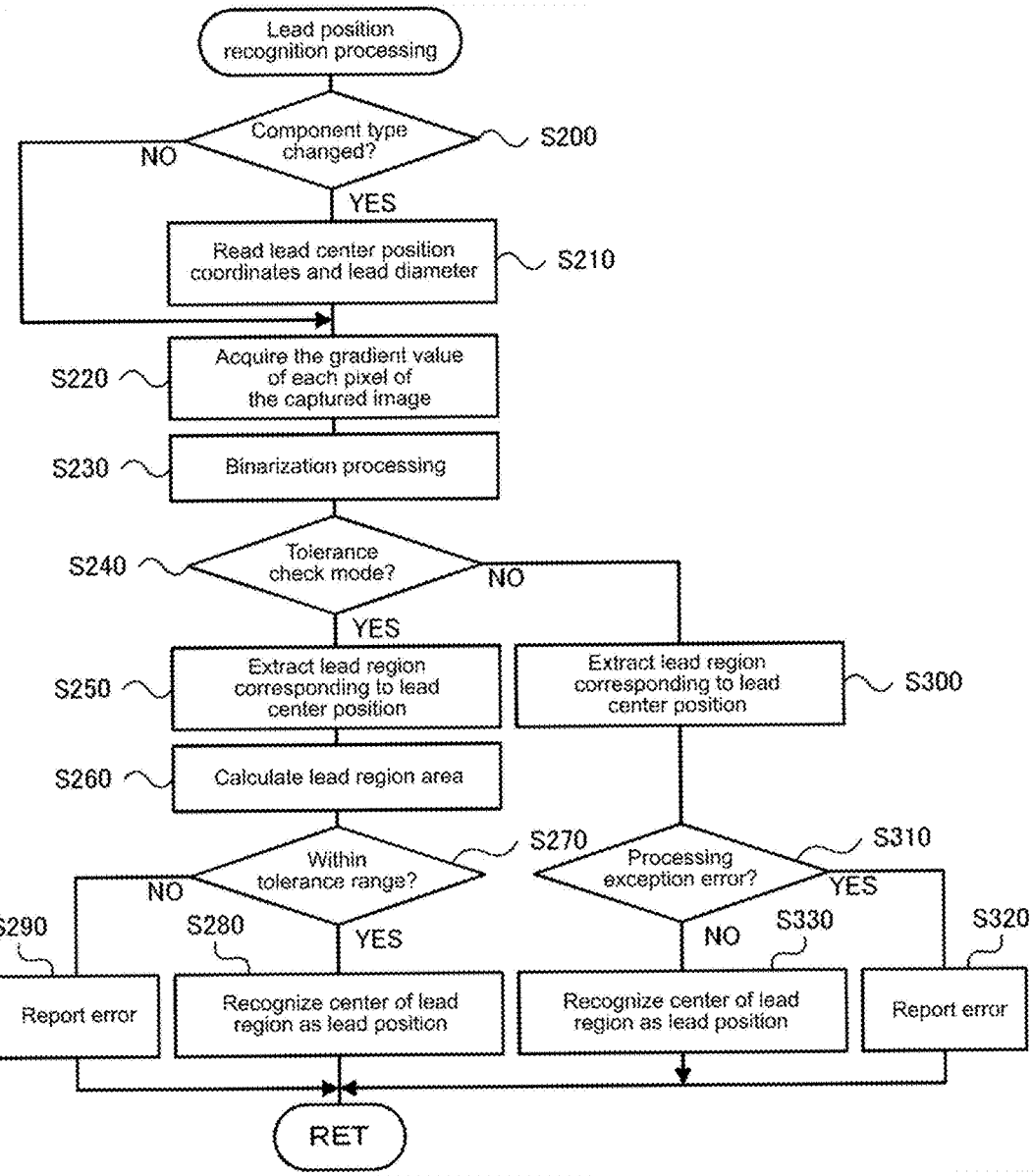
FIG. 5 is a flowchart showing an example of lead position recognition processing.

Next, lead position recognition processing of S130 is described. FIG. 5 is a flowchart showing an example of lead position recognition processing. Note that, images for which the gradient value of each pixel is 8-bit grayscale are acquired as captured images.

In lead position recognition processing, control device 50, first, determines whether the component type that is the current target for processing has changed from the previous target for processing (S200). Control device 50, upon determining that the component type has changed, reads the lead diameter and the coordinates of the center position of each lead L of the corresponding component type from the component information memorized on memory section 52 (S210). Note that, control device 50, upon determining that the component type has not changed in S200, may skip the processing of S210.

Next, control device 50 acquires the gradient value of each pixel of the captured image (S220), then performs binarization processing of binarizing each pixel using a specified binarization threshold (S230). Binarization may be performed using a well-known method such as P-tile, mode, or discriminant analysis appropriate for detecting leads L (tip surfaces) within the image. When binarization is performed, control device 50 determines whether the execution mode of the current lead position recognition processing is tolerance check mode (S240). In the present embodiment, control device 50 is able to perform two execution modes for lead position recognition processing: tolerance check mode (first recognition processing) and non-tolerance check mode (second recognition processing). Also, an operator is able to select tolerance check mode and non-tolerance check mode using selection button 29 of operation panel 28, with control device 50 performing the mode selected by the operator.

Figure 6:
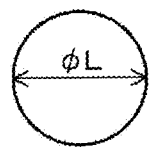
FIG. 6 illustrates an example of a tolerance range.
Figure 6:
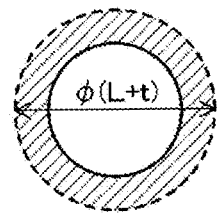

Here, FIG. 6 illustrates an example of a tolerance range. The tolerance range is defined based on the diameter φL of lead L (FIG. 6[a]), the diameter of the insertion hole, or the like. In the present embodiment, the tolerance range is defined as the range of diameter φ (L+t) that is tolerance t added to diameter φL of lead L (FIG. 6[b]). Tolerance t, for example, is set such that the area of diameter φ (L+t) is a multiple (2 to 3 times, for example) of the area of diameter φL. Note that, the tolerance range may be set such that a tolerance t of a few millimeters is added to diameter φL. The tolerance range (tolerance t) may be set by an operator using operation panel 28 or the like.

Control device 50, upon determining in S240 that the mode is tolerance check mode, performs extraction processing of lead regions corresponding to the center position of leads L from the binarized image (S250), then calculates the area of the lead region (S260). Continuing, control device 50 determines whether the calculated lead region area is within the tolerance range (S270).

Figure 7:
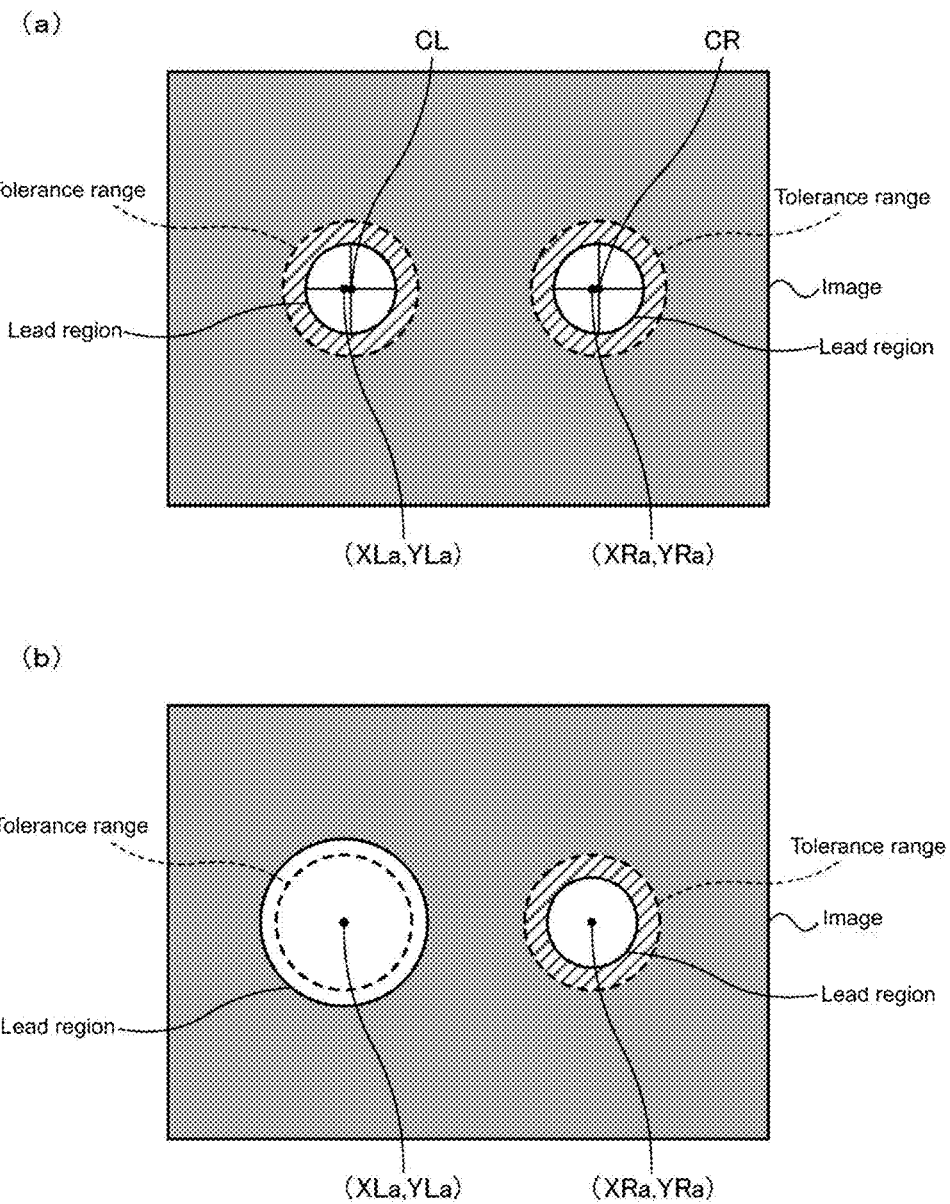
FIG. 7 illustrates an example of a recognition state of a lead position using the tolerance range.

FIG. 7 illustrates an example of a recognition state of a lead position using the tolerance range. As shown, control device 50 extracts as the lead region a collected region of pixels for which the binarized pixel value is a value of a color (white) indicating a lead L, the region including each of the center positions (XLa, YLa) and (XRa, YRa) of leads L from S250. Note that, control device 50 may extract a collection region of pixels for which the binarized value is a value of a color (white) indicating a lead L, and then extract as a lead region a region from the extracted region such that the distance between the center of the regions corresponds to the distance between the center of the leads L. In this case, memory section 52, instead of the center positions of leads L, memorizes relative position information such as the distance between the centers of the leads L. Control device 50 determines that the area of the lead region is within the tolerance range in a case shown in FIG. 7(a), and determines that the area of the lead region on the left is outside the tolerance range in a case shown in FIG. 7(b). Note that, control device 50 determines that the area of the lead region is outside the tolerance range when the lead region is large due to foreign matter such as dirt or dust is adhered to lead L, or when a viscous fluid such as solder S or plating has been applied to the tip of the lead L. Control section 50, upon determining in S270 that the area of the lead region is within the tolerance range, recognizes the center position of the extracted lead region as the center position of lead L of component P being gripped by component chuck device 22 (S280), then ends processing. In the example of FIG. 7(a), control device 50 recognizes center position CL of the lead region on the left and center position CR of the lead region on the right as the respective center positions of the leads L. On the other hand, control device 50, upon determining in S270 that the area of the lead region is outside the tolerance range, reports an errors (S290), then ends processing. In other words, control device 50 determines a defect and issues an error notice when the area of the lead region exceeds the tolerance range that represents the maximum area that is allowable.

Also, control device 50, upon determining in S240 that the mode is the non-tolerance check mode rather than the tolerance check mode, similar to S250, performs extraction processing of extracting the lead region from the binarized image (S300). Then, control device 50 determines whether a specified processing exception error has occurred (S310).

Figure 8:
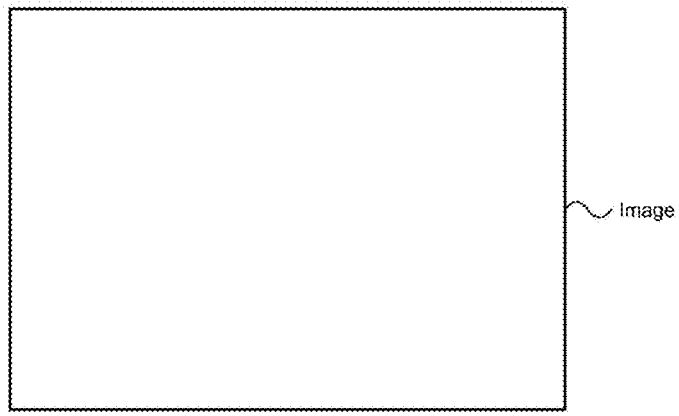
FIG. 8 illustrates an example of a processing exception error.
Figure 8:
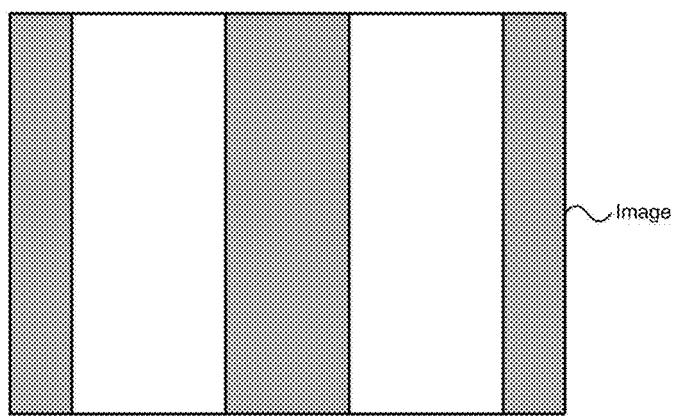

FIG. 8 illustrates an example of a processing exception error. As shown, a processing exception error corresponds to a case in which the pixel values for the entire binarized image are values of the color (white) indicating a lead L such that the lead region cannot be extracted (FIG. 8[*a*]), or a case in which the extracted region (the white region in the image) is extremely large (FIG. 8[*b*]). Note that, an extremely large lead region may arise, for example, in a case in which the area of the diameter φL of the lead region is many times larger (for example, 25 times or 30 times larger) when using a value such that the area of diameter φ(L+t) when using tolerance t is several times the area of diameter φL.

Control device 50, upon determining that a processing exception error has occurred in S310, reports the error (S320), then ends processing. That is, control device 50, in a case in which the processing target is an exception such as when the area of the lead region is extremely large, determines a defect and reports an error without recognizing the position of lead L. On the other hand, control device 50, upon determining in S310 that there is no processing exception error, recognizes the center position of the lead region extracted in S300 as the center position of lead L of component P being gripped by component chuck device 22 (S330), then ends processing. In this manner, control device 50, when performing non-tolerance check mode, recognizes the center position of the extracted lead center as the center position of lead L as is without determining whether the extracted lead region is within the tolerance range.

Figure 9:
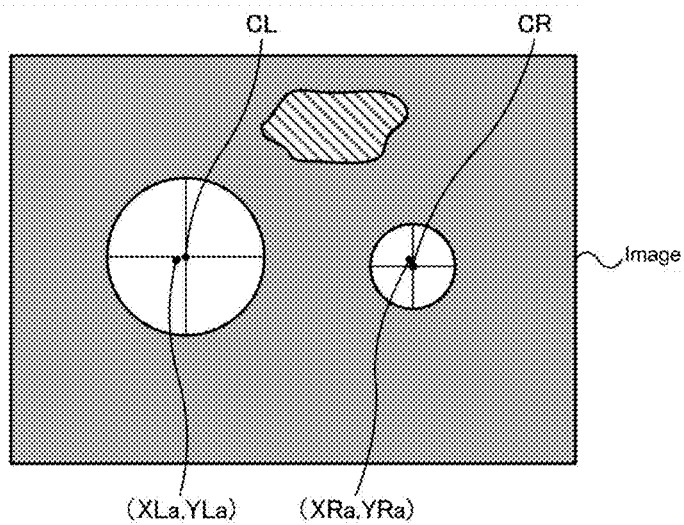
FIG. 9 illustrates an example of recognizing a lead position without using a tolerance range.

FIG. 9 illustrates an example of recognizing a lead position without using a tolerance range. As shown, the center position of the lead region is recognized as the respective center positions CL and Cr of the leads as is without comparing the lead regions to a tolerance range. Note that, as shown in FIG. 9, a region other than a lead region appears in the image (a region shown by hatching), but this region does not include the center position of a lead L, and does not correspond to a center position of a lead L. Therefore, control device 50, in processing of S300, does not consider this region as a candidate region when recognizing the lead position so does not extract it. Thus, control device 50 is able to prevent misrecognition of the center position of lead L due to treating this region as a lead region.

Correspondences between constituent elements of the present embodiment and constituent elements of the disclosure will be clarified here. Component mounting device 10 of the present embodiment corresponds to a component mounting device of the present disclosure, component camera 30 corresponds to an imaging device, and control device 50 corresponds to a processing section. Also, memory section 52 corresponds to a memory section, and operation panel 28 (selection button 29) corresponds to a receiving section. Note that, from descriptions of operation of component mounting device 10 of the present embodiment, an example of a position recognition method of the present disclosure is also clear.

Component mounting device 10 as described above is able to selectively perform a tolerance check mode that recognizes a position of a lead L after determining whether the size of a lead region is within a tolerance range (region determination), and a non-tolerance check mode that recognizes a position of a lead L without performing determination of whether the size of the lead region is within the tolerance range. Therefore, even in cases in which it is difficult to set a tolerance range due to the tip of the lead L being covered with a viscous fluid such as solder S or plating, the position of lead L is appropriately recognized.

Also, because component mounting device 10 extracts a collection region corresponding to a center position of leads L memorized on memory section 52, in the non-tolerance check mode, it is possible to prevent misdetection of the position of lead L.

Further, because component mounting device 10, in the non-tolerance check mode, checks whether a processing exception error occurred corresponding to a case in which the size of the lead region was in a specified exception range, it is possible to prevent misdetection of the position of lead L.

Also, because component mounting device 10 receives the selection of the tolerance check mode or the non-tolerance check mode from an operator, the position of lead L can be detected appropriately with greater freedom for an operator to select processing. For example, when mounting a component P for which a relatively high mounting accuracy is required, an operator may select the tolerance check mode, but when mounting a component P with solder S applied, the operator may select the non-tolerance check mode.

Meanwhile, it goes without saying that the disclosure is not limited to the above-mentioned embodiment and various embodiments may be applied within the technical scope of the disclosure.

For example, in an embodiment above, a collected region of pixels of a color indicating lead L and corresponding to a center position of lead L memorized on memory section 52 is extracted as the lead region, but the configuration is not limited to this, a collected region of pixels simply indicating lead L may be extracted as the lead region.

In an embodiment above, a check for a processing exception error is performed in the non-tolerance check mode, but the configuration is not limited to this, and it is not necessary to perform a check for a processing exception error. In this case, in the non-tolerance check mode, control device 50 omits processing of S310 and S320, and may recognize the center of the lead region extracted in S300 as the lead center in S330.

In an embodiment above, the selection of the tolerance check mode and the non-tolerance check mode is received from an operator, but either of the modes may be performed selectively without receiving a selection from an operator. For example, control device 50, in a case in which it is possible to receive information about whether a viscous fluid such as solder S is on lead L of component P, may select which mode to use based on the acquired information. That is, control device 50, in a case of acquiring information indicating that solder S or the like is not on lead L, may recognize the position of lead L with the tolerance check mode, and, in a case of acquiring information indicating that solder S or the like is on lead L, may recognize the position of lead L with the non-tolerance check mode.

In an embodiment above, it is possible to selectively perform the tolerance check mode and the non-tolerance check mode, but the configuration is not limited to this, and it is possible to performed only the non-tolerance check mode. That is, control device 50 may perform recognition processing to recognize the position of the lead L based on the lead region without performing a determination of whether the lead region extracted from the captured image is within the specified tolerance range.

INDUSTRIAL APPLICABILITY

The present disclosure may be applied to mounting work of mounting components on a board.

REFERENCE SIGNS LIST

10: component mounting device;
12: component supply device;
13: tape feeder;
16: board conveyance device;
18: board holding device;
20: head;
22: component chuck device;
24: moving mechanism;
26: mark camera;
28: operation panel;
29: selection button;
30: component camera;
32: imaging element;
34: lens;
36: lighting device;
50: control device;
52: memory section;
B: board;
L: lead;
P: component;
S: solder

The invention claimed is:

1. A component mounting device for mounting a component with a lead onto a board by inserting the lead into an insertion hole of the board, the component mounting device comprising:
   an imaging device configured to image the component in a state being held; and
   a processing section configured to perform recognition processing for recognizing a center position of the lead by processing a captured image captured by the imaging device, the processing section being further configured to selectively perform
      first recognition processing of extracting a lead region from the captured image corresponding to an area of the an end of the lead, performing region determination of determining whether a size of the lead region is within a specified tolerance range based on the area, and when the size of the lead region is determined to be within the specified tolerance range, the center position of the lead is recognized based on a center of the lead region, and
      second recognition processing of extracting the lead region from the captured image and recognizing the center position of the lead based on the lead region without performing the region determination based on the specified tolerance range.

2. The component mounting device according to claim 1, further comprising
   a memory section configured to memorize position information of the lead for the component, wherein
   the processing section extracts from the captured image a region corresponding to a position based on the position information of the lead as the lead region.

3. The component mounting device according to claim 1, wherein
   the processing section, during the second recognition processing, recognizes the center position of the lead based on the lead region after checking that the size of the lead region does not correspond to a specified exception range that is larger than the tolerance range.

4. The component mounting device according to claim 1, further comprising
   a receiving section configured to receive a selection by an operator of either the first recognition processing or the second recognition processing, wherein
   the processing section performs the first recognition processing or the second recognition processing based on the selection by the operator.

5. A position recognition method for recognizing a center position of a lead of a component, the position recognition method comprising:
   (a) imaging the component in a state being held; and
   (b) performing recognition processing for recognizing the center position of the lead by processing a captured image captured in (a),
   wherein in (b) the following steps are selectively performed:
      a step (b1) of extracting a lead region from the captured image corresponding to an area of the an end of the lead, performing region determination of determining whether a size of the lead region is within a specified tolerance range based on the area, and when the size of the lead region is determined to be within the specified tolerance range, recognizing the center position of the lead based on the lead region, and
      a step (b2) of extracting the lead region from the captured image and recognizing the center position of the lead based on the lead region without performing the region determination.

* * * * *